United States Patent [19]
Kobayashi

[11] Patent Number: 6,163,222
[45] Date of Patent: Dec. 19, 2000

[54] BUFFER AMPLIFIER WITH FREQUENCY SELECTIVE MECHANISM

[75] Inventor: Hiroki Kobayashi, Fukushima-ken, Japan

[73] Assignee: Alps Electric Co., Ltd., Japan

[21] Appl. No.: 09/314,694

[22] Filed: May 19, 1999

[30] Foreign Application Priority Data

May 28, 1998 [JP] Japan ................................. 10-146880

[51] Int. Cl.[7] .................................................. H04B 1/18
[52] U.S. Cl. ...................... 330/302; 330/306; 455/188.1; 455/180.1; 455/318
[58] Field of Search .................................... 330/302, 306, 330/305, 129; 333/174, 176; 455/188.1, 180.1, 318, 319

[56] References Cited

U.S. PATENT DOCUMENTS 5,960,334   9/1999   Nakano ................................ 330/306

FOREIGN PATENT DOCUMENTS 0170710   7/1990   Japan ................................ 333/174
9-307365   11/1997   Japan .

Primary Examiner—Michael B Shingleton
Attorney, Agent, or Firm—Brinks Hofer Gilson & Lione

[57] ABSTRACT

A buffer amplifier to be connected to an oscillator for outputting an oscillation signal, comprising an amplifier circuit for amplifying the level of the oscillation signal and frequency selective means connected to the output terminal of the amplifier circuit, wherein the fundamental harmonic or the secondary higher harmonic of the oscillation signal is outputted by switching the frequency selective means.

1 Claim, 2 Drawing Sheets

BUFFER AMPLIFIER WITH FREQUENCY SELECTIVE MECHANISM

BACKGROUND OF THE INVENTION

1. Field of the Invention

The present invention relates to a buffer amplifier for amplifying an oscillation signal of an oscillator used in a portable telephone or the like.

2. Related Art

A communication frequency band used by a portable telephone differs according to communication systems. For example, it is 900 MHz in the frequency division multiple access (FDMA) and 2.29 GHz in the code division multiple access (CDMA).

A buffer amplifier in a conventional portable telephone which is used for, for example, both the FDMA and CDMA will be described with reference to FIG. 4.

In FIG. 4, the buffer amplifier comprises a transistor 31 for amplifying the level of an inputted oscillation signal, an inductor 32 which has an end connected to the collector of the transistor 31 so as to supply a voltage to the collector of the transistor 31, and capacitors 33 and 34 which are connected in parallel to the inductor 32 in a high frequency receiving manner.

A source voltage input terminal 35 is connected to the other end of the inductor 32 so that a voltage is supplied to the collector of the transistor 31 via the inductor 32. The capacitors 33 and 34 which are connected in series at their one ends are coupled to the collector of the transistor 31. The other end of the capacitor 33 is connected to the collector of the transistor 31 and the other end of the capacitor 34 is connected to the emitter of the transistor 31.

The connection point of the capacitors 33 and 34 is grounded via a change-over switch 36.

An oscillator change-over switch 38 is connected to the base of the transistor 31 via a coupling capacitor 37. Two oscillators 39 and 40 having different oscillation frequencies are connected to the oscillator change-over switch 38. The oscillator 39 produces oscillation at the frequency (900 MHz) of the FDMA and the oscillator 40 produces oscillation at the frequency (2.29 GHz) of the CDMA.

A by-pass capacitor 41 and a resistor 42 which are connected in parallel are coupled to the emitter of the transistor 31 and one ends of the by-pass capacitor 41 and the resistor 42 are connected to the ground.

Resistors 44 and 45 which are connected in series at their one ends are coupled to the connection point of the inductor 32 and the source voltage input terminal 35. The other end of the resistor 45 is grounded. A bias voltage is applied to the base of the transistor 31 from the connection point of the resistors 44 and 45.

A mixer 47 is connected via a capacitor 46 to the connection point of the collector of the transistor 31 and the capacitor 33.

For example, in case of using the circuit in the FDMA, the oscillator change-over switch 38 is changed over so that an oscillation signal is supplied from the oscillator 39 to the base of the transistor 31 and the change-over switch 36 is turned on.

Consequently, a parallel resonance circuit is constructed by the inductor 32 and the capacitors 33 and 34 which are connected in parallel in a high frequency receiving manner. By tuning the resonance frequency of the parallel resonance circuit to the fundamental harmonic (900 MHz) of the oscillation signal of the FDMA, only the fundamental harmonic in the oscillation signal of the FDMA is outputted to the mixer 47.

In case of using the circuit in the CDMA, the oscillator change-over switch 38 is changed over so that an oscillation signal is supplied from the oscillator 40 to the base of the transistor 31 and the change-over switch 36 is turned off.

Consequently, a parallel resonance circuit is formed by the inductor 32 and the capacitor 33. By tuning the resonance frequency of the parallel resonance circuit to the fundamental harmonic (2.29 GHz) of the oscillation signal of the CDMA, only the fundamental harmonic of the oscillation signal in the CDMA is outputted to the mixer 47.

In the conventional buffer amplifier as described above, since only fundamental harmonics of the two oscillation signals required in both of the FDMA and CDMA are amplified, two oscillators are necessary and the cost is accordingly high.

SUMMARY OF THE INVENTION

It is an object of the invention to provide a buffer amplifier to solve the problem, in which two oscillation signals can be outputted from a single oscillator.

According to the invention, in order to solve the problem, there is provided a buffer amplifier to be connected to an oscillator for generating an oscillation signal, comprising an amplifier circuit for amplifying the level of the oscillation signal and frequency selective means connected to the output terminal of the amplifier circuit, wherein a fundamental harmonic or a secondary higher harmonic of the oscillation signal is outputted by switching the frequency selective means.

According to a buffer amplifier of the invention, the frequency selective means serves as a trap circuit for trapping the secondary higher harmonic when the fundamental harmonic is outputted, and the frequency selective means serves as a high pass filter for passing the secondary higher harmonic or higher harmonics when the secondary higher harmonic is outputted.

According to a buffer amplifier, the frequency selective means has first and second capacitors which are connected in series at their one ends, a coil and a third capacitor which are connected in series at their one ends and construct the trap circuit, and a switching diode, the other end of the first capacitor is connected to the output terminal of the amplifier circuit, the other end of the coil is connected to a connection point of the first and second capacitors, the other end of the third capacitor is connected to the ground in a high frequency receiving manner, the switching diode is connected to the third capacitor in parallel, the switching diode is made non-conductive when the fundamental harmonic is outputted, the switching diode is made conductive when the secondary higher harmonic is outputted, and the high bass filter is constructed by the first and second capacitors and the coil.

DETAILED DESCRIPTION OF THE PREFERRED EMBODIMENT

Figure 1:
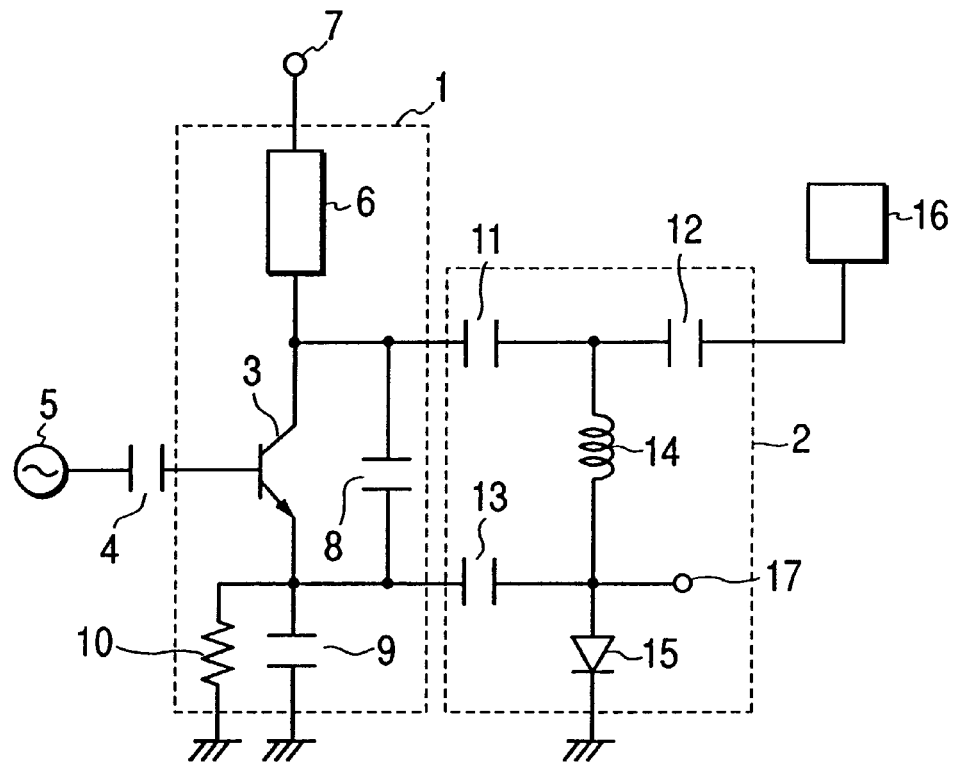
FIG. 1 is a circuit diagram of a buffer amplifier of the invention.

A buffer amplifier of the invention will be described with reference to FIG. 1. In FIG. 1, the buffer amplifier comprises an amplifier circuit 1 for amplifying the level of an inputted oscillation signal and a frequency selective means 2.

The amplifier circuit 1 has a transistor 3. An oscillator 5 is connected to the base of the transistor 3 via a coupling capacitor 4. The oscillator 5 produces oscillation at 900 MHz when used in the FDMA. The oscillator 5 produces oscillation at 1.145 GHz when used in the CDMA by slightly changing the circuit mode in the oscillator 5 by a switching operation.

A voltage is supplied from a source voltage input terminal 7 which is connected via an inductor 6 to the collector of the transistor 3. A capacitor 8 is interposed between the collector and the emitter of the transistor 3.

The emitter of the transistor 3 is connected to the ground via a by-pass capacitor 9 and a resistor 10. Although not shown, a bias voltage is supplied by a bias resistance to the base of the transistor 3.

The frequency selective means 2 has a first capacitor 11 and a second capacitor 12 which are connected in series at their one ends, a third capacitor 13 and a coil 14 which are connected in series at their one ends and construct a trap circuit for trapping secondary higher harmonics, and a switching diode 15.

The other end of the first capacitor 11 is connected to the collector of the transistor 3 and the other end of the second capacitor 12 is connected to a mixer 16. The other end of the coil 14 is connected to the connection point of the first and second capacitors 11 and 12, and the other end of the third capacitor 13 is connected to the emitter of the transistor 3.

The switching diode 15 is connected between the connection point of the third capacitor 13 and the coil 14 and the ground. The cathode of the switching diode 15 is grounded. The anode of the switching diode 15 is provided with a control voltage input terminal 17 for receiving a control voltage to make the switching diode 15 conductive.

Figure 2:
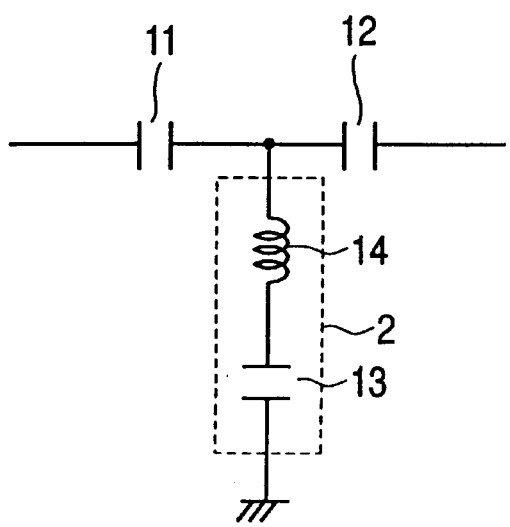
FIG. 2 is a diagram of an equivalent circuit of frequency selective means when a switching diode is made non-conductive in the buffer amplifier of the invention.

For example, when the buffer amplifier is used in the FDMA, the oscillator 5 produces oscillation at 900 MHz and the control voltage is not applied to the control voltage input terminal 17. Since the voltage is not, accordingly, applied to the switching diode 15, the switching diode 15 is made non-conductive and the frequency selective means 2 serves as an equivalent circuit shown in FIG. 2.

At this time, the frequency selective means 2 serves as a trap circuit by the third capacitor 13 and the coil 14. By preliminarily setting the trap frequency of the trap circuit to 1.8 GHz as the frequency of the secondary higher harmonic, the secondary higher harmonic is reduced and the fundamental harmonic is supplied to the mixer 16.

When used in the CDMA, by slightly changing the circuit mode in the oscillator 5 by a switching operation, the oscillator 5 produces oscillation at 1.145 GHz and the oscillation signal is supplied to the base of the transistor 3. The oscillator 5 also produces higher harmonics including secondary higher harmonic except for 1.145 GHz which is the fundamental harmonic.

Figure 3:
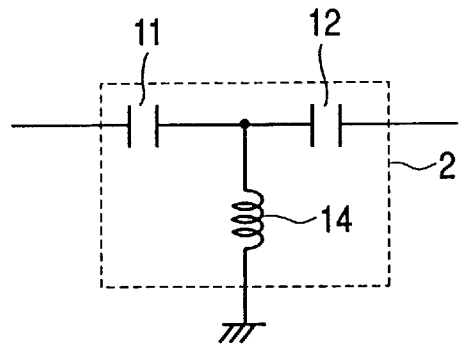
FIG. 3 is a diagram of an equivalent circuit of the frequency selective means when the switching diode is made conductive in the buffer amplifier of the invention.
Figure 4:
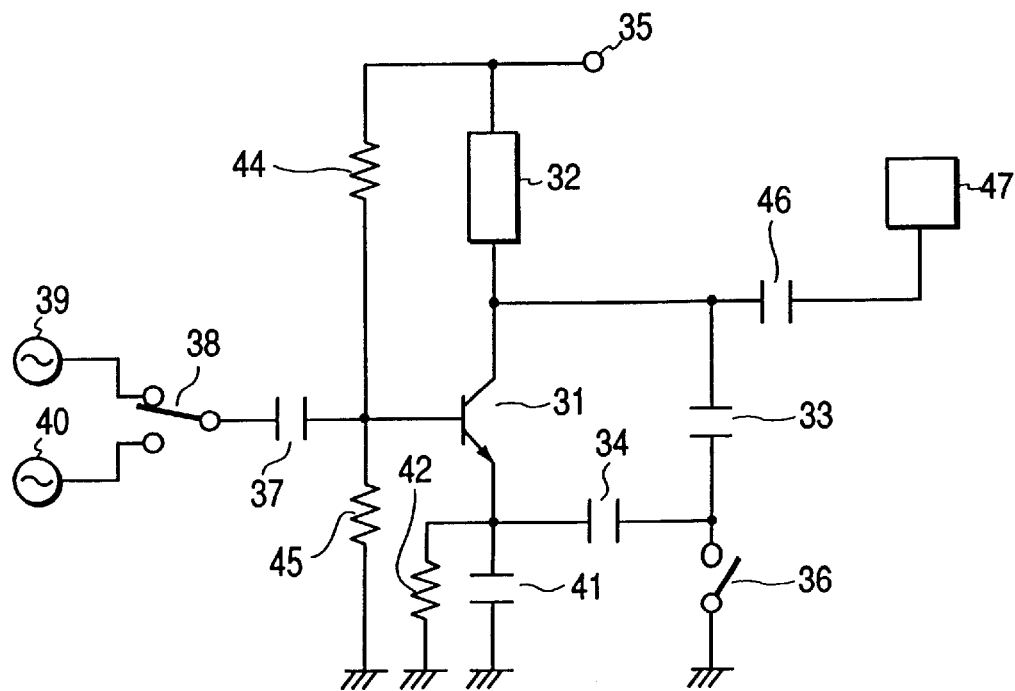
FIG. 4 is a circuit diagram of a conventional buffer amplifier.

When the control voltage is applied to the control voltage input terminal 17, the switching diode 15 is made conductive and the frequency selective means 2 serves as an equivalent circuit shown in FIG. 3.

At this time, the frequency selective means 2 serves as a T-type high pass filter by the first capacitor 11, the second capacitor 12, and the coil 14. By setting the cut-off frequency of the high pass filter so that the harmonics higher than the secondary higher harmonic can pass, the level of the secondary higher harmonic, that is, the frequency of 2.29 GHz is amplified and the resultant harmonic is outputted.

By making the switching diode 15 conductive or nonconductive as described above, the frequency selective means 2 can be switched to function between the trap circuit and the high pass filter. Only by allowing the single oscillator 5 to generate oscillation signals of slightly different frequencies, the fundamental harmonic and higher harmonic having frequencies which are largely different from each other can be generated from the buffer amplifier.

As mentioned above, by constructing the buffer amplifier of the invention by the amplifier circuit for amplifying the level of an oscillation signal and the frequency selective means for selecting either the fundamental harmonic or the secondary higher harmonic of the oscillation signal, two oscillation signals having frequencies which are largely different can be obtained by using only the single oscillator. Consequently, the oscillator can be constructed at low cost.

In the buffer amplifier of the invention, two local oscillation signals of the fundamental harmonic and the higher harmonic can be controlled in such a manner that when the frequency of the fundamental harmonic is selected, the frequency selective means serves as a trap circuit for trapping the secondary higher harmonic. In case of selecting the frequency of the secondary higher harmonic, the frequency selective means serves as a high pass filter for passing the secondary higher harmonic or higher harmonics.

In the buffer amplifier of the invention, the frequency selective means comprises the first capacitor, the second capacitor, the coil, and the switching diode, the first and second capacitors are connected in series to the output terminal of the amplifier circuit, the coil and the third capacitor which are connected in series are interposed between the connection point of the first and second capacitors and the ground, and the switching diode is connected to the third capacitor in parallel. In case of selecting the frequency of the fundamental harmonic, the switching diode is made conductive. In case of selecting the frequency of the secondary higher harmonic, the switching diode is made non-conductive. Consequently, switching between the communication systems can be easily made by making the switching diode conductive or non-conductive.

What is claimed is:

1. A buffer amplifier connected to an oscillator to generate an oscillation signal, comprising:

an amplifier circuit to amplify a level of the oscillation signal; and a frequency selective mechanism connected to an output terminal of the amplifier circuit, the frequency selective mechanism having first, second and third capacitors, a coil, and a switching diode, wherein one of a fundamental harmonic and a secondary higher harmonic of the oscillation signal is outputted by switching the frequency selective mechanism, the frequency selective mechanism serves as a trap circuit to trap the secondary higher harmonic when the fundamental harmonic is outputted and serves as a high pass filter to pass one of the secondary higher harmonic and higher harmonics when the secondary higher harmonic is outputted, the first and second capacitors are connected in series, one end of the first capacitor being connected to the output terminal of the amplifier circuit, the coil and third capacitor are connected in series with each other, one end of the coil being connected between the first and second capacitors, one end of the third capacitor being connected to ground at high frequency, the coil and third capacitor constructing the trap circuit, the high pass filter being constructed by the first and second capacitors and the coil, and the switching diode is connected to the third capacitor in parallel, the switching diode being non-conductive when the fundamental harmonic is outputted and being conductive when the secondary higher harmonic is outputted.

\* \* \* \* \*